United States Patent [19]
Hammond et al.

[11] Patent Number: 5,911,824
[45] Date of Patent: Jun. 15, 1999

[54] METHOD FOR GROWING CRYSTAL

[75] Inventors: David A. Hammond, South Euclid; Jan J. Buzniak, Shaker Heights; Kimberly A. Grencewicz, Westlake; Milan R. Vukcevich, Cleveland, all of Ohio

[73] Assignee: Saint-Gobain Industrial Ceramics, Inc., Worcester, Mass.

[21] Appl. No.: 08/991,760

[22] Filed: Dec. 16, 1997

[51] Int. Cl.⁶ .................................................. C30B 21/02
[52] U.S. Cl. ................................................ 117/81; 117/83
[58] Field of Search .................................. 117/3, 81, 83; 427/122, 126.2

[56] References Cited

U.S. PATENT DOCUMENTS 5,476,679 12/1995 Lewis et al. ............................ 427/122
5,656,077 8/1997 Kawase .................................. 117/200

FOREIGN PATENT DOCUMENTS

H5-97549 4/1993 Japan ............................. C04B 41/85
H6-122579 5/1994 Japan ............................. C04B 41/87

*Primary Examiner*—Felisa Hiteshew
*Attorney, Agent, or Firm*—Volker R. Ulbrich

[57] ABSTRACT

Alkali halide crystal is grown from a melt in a novel graphite crucible which has a surface depth region of its inside surface impregnated with glassy carbon to eliminate porosity, so that the melt does not leak through or wet the carbon. Additionally, the graphite may be coated with glassy carbon to provide a smoother surface. Also disclosed is a porous graphite crucible lined with a layer of graphitic pyrolytic carbon to prevent wetting of the surface by the melt and to permit release of the cooled crystal without remelting.

6 Claims, 1 Drawing Sheet

METHOD FOR GROWING CRYSTAL

TECHNICAL FIELD

The invention relates generally to methods and apparatus for processing materials in a carbon crucible in their molten state and relates more particularly to growing monocrystalline inorganic materials.

BACKGROUND OF THE INVENTION

Some processes performed on inorganic materials require the material to be in a molten state. Many such materials have a rather high melting point and are also corrosive in their molten form. One material which has particularly favorable qualities for use as a crucible for such materials is carbon, usually in the form of one of a number of different grades of graphite. Graphite has a theoretical density of 2.25 g/cc (grams per cubic centimeter) and a porosity between 10% and 25% of this theoretical density, depending upon the method by which it is manufactured. The porosity is a combination of closed and open porosity. Graphite can withstand very high temperatures and is unreactive with most of the inorganic materials for which processing in a carbon crucible would be contemplated. However, some inorganic materials which would otherwise be candidates for processing in a carbon crucible present special problems. Some leak through open pores in the graphite in their molten state and/or adhere to the graphite upon cooling to their solid state, so that they cannot be readily removed from the crucible without damage to either the inroganic material or the crucible. Alkali metal halide materials are in this latter category. For this reason, such materials are presently processed in their molten state only in precious metal crucibles, which are very costly.

Highly pure crystals of alkali metal halide material are useful as optical elements and as scintillation crystals in various types of radiation detectors. They may be sodium iodide (NaI), cesium iodide (CsI), or other compounds of this family. Sodium iodide doped with a very low concentration of thallium is of particular interest because it is widely used as a scintillation material for detecting x-rays for medical and other applications. The crystals are typically grown in a vertical Stockbarger furnace.

For growing sodium iodide in a vertical Stockbarger furnace, the raw material, which either already contains or has later added to it any desired dopants for establishing scintillation characteristics, is loaded in granular form as a charge into a crucible of platinum or other noble metal of the platinum series, platinum-rhodium alloy, platinum-iridium alloy, rhodium, or iridium. A noble metal is required in order to prevent contamination of the crystal with a more reactive material and also to withstand the highly corrosive effects of the alkali halide in its molten state.

The loaded crucible is placed into the upper portion of a Stockbarger furnace in a nonreactive gas. The furnace is then partially-evacuated and heated, so that all the material of the charge in the crucible becomes a melt. The crucible is then very slowly moved downward inside the furnace under controlled temperature conditions to move the freezing zone axially upwards inside the crucible while crystallization takes place, starting at the bottom of the crucible and moving upwards until all the melt has been crystallized to form a boule of monocrystalline material. By "monocrystalline" is meant that the boule does not consist entirely of microcrystalline material, but may consist of a plurality of crystals which are relatively large, much larger than microcrystals. Ideally, there is only a single crystal which makes up the boule. A plurality of crystals results in grain boundaries within the boule, which are undesirable discontinuities in the crystallinity and tend to trap impurities.

There are several serious drawbacks to the above-described present method of growing alkali halide crystals. The first is that the noble metal crucibles are very costly, costing on the order of hundreds of thousands of dollars each for making large crystals. They are generally made thin to accommodate differences in thermal expansion. Therefore, they also are made round to provide sufficient strength. This limits the crystal geometry to a round one and results in alkali halide material waste when rectilinear crystals are made from the crystal. Finally, and of particular significance, is that a meltout procedure is required to remove the boule from the crucible. The cooled boule adheres tenaciously to the surface of the crucible. In order to remove the boule without destroying the crucible and the boule in the process, it is necessary to heat the crucible until the boule surface region in contact with it remelts to permit its separation from the crucible. This remelting procedure is both time consuming, costly, and hazardous. The remelting takes place at temperatures above 800° C. and is accompanied by the outgassing of toxic fumes from the boule which necessitates the provision of costly ventilation and other safety equipment.

Fused silica or fused quartz can be used as a crucible material, but these present problems similar to those for platinum in that the crystal must be melted out hot before cooling to room temperature. They are also fragile crucible materials.

There is therefore a need for an improved process for growing alkali halide crystals. One approach has been to use a crucible of carbon, such as graphite. Graphite has been used as a crucible material for growing other materials, such as alkali earth halide, calcium fluoride, and barium fluoride. It has the desirable properties of being very resistant to corrosion by these inorganic crystal materials, being able to withstand the high temperature needed to melt the crystal material, and resulting in little contamination. Unfortunately however, graphite is porous. When it is used as a crucible material for alkali metal halide crystal growth, the melt leaks into and through the crucible, thus making such a crucible unsuitable for alkali metal halide crystal growth. In addition, alkali metal halide and other materials tend to adhere to the surface of the graphite upon cooling, thereby preventing their ready removal from the crucible without damage to either the boule or the crucible. Thus far, no feasible alternatives to noble metal crucibles have been found for commercially growing alkali metal halide crystals.

SUMMARY OF THE INVENTION

In accordance with the novel method of the present invention, an alkali metal halide crystal is grown in a novel crucible made of porous carbon, such as graphite, which has its inside surface lined with a protective, non-porous lining of carbon of a type which is not wet by molten alkali metal halide. By "porous" in this context is meant that the carbon is wet by and permeable to molten alkali metal halide. The lining seals or covers the open pores in the carbon of the crucible to prevent leaking of the melt out of the crucible and also to prevents the melt from wetting the inside crucible surface. Additionally, contamination of the melt by dust particles created during machining of the crucible is prevented. Suitable lining materials are glassy carbon and other pyrolytic carbon. The term "pyrolytic carbon" as used herein means carbon which has resulted from a process of decomposition by heat. It is taken to include glassy and other carbons deposited by sputtering or chemical vapor deposition. The lack of adherence between the crystal and the crucible permits removal of the crystal from the crucible without remelting of that part of the crystal which is in contact with the crucible.

A crucible in accordance with the invention can be relatively inexpensive. Because the material of which the crucible is made is not very costly, the walls can be made thick and strong, so that the crystal geometry is no longer limited to one with a round cross-section. Most importantly, the cooled crystal does not adhere to the inside surface of the crucible. This permits removal of the crystal from the crucible without a hot meltout process.

DETAILED DESCRIPTION OF A PREFERRED EMBODIMENT

Figure 1:
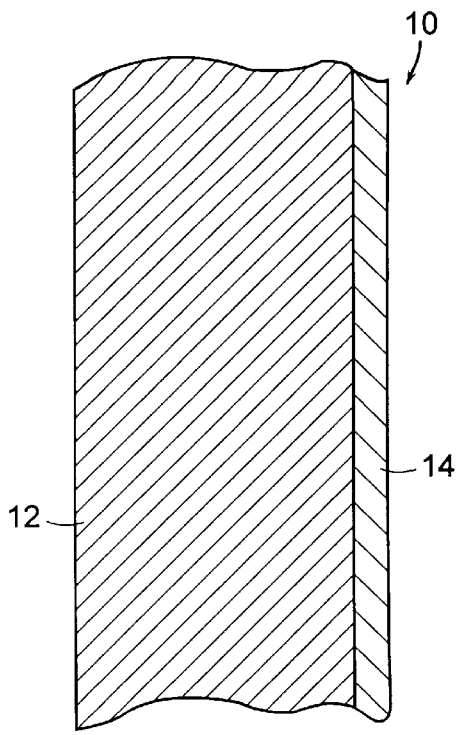
FIG. 1 is a schematic, cross-sectional view of a fragment of a coated crucible in accordance with one embodiment of the novel invention.

A preferred embodiment of a crucible in accordance with the present invention is the crucible 10, of which a wall fragment section is shown in FIG. 1 of the drawing. The main support wall 12 is of porous graphite. The graphite crucible is fabricated from ATJ grade, Stackhouse 2020 grade, or any other high purity molded graphite with very similar thermal expansion characteristics. The crucible is then purified by a known high temperature chlorine process before the coating is applied. The crucible wall thickness typically ranges from one-half inch to one or more inches, depending upon the size of the crucible. At least the entire inside surface of the crucible is then coated with a lining 14 of a material which is compatible with the crystal growth process, but is not wet by the melt. The lining material 14 is graphitic pyrolytic carbon or any other uniform dense carbon coating, such as glassy carbon, which is not wet by the melt. Graphitic pyrolytic carbon has a density of between 2.18 and 2.22 g/cc (grams per cubic centimeter) and almost no porosity. It has a defined graphitic crystalline structure and can be coated on a surface only in a very thin layer, by which it takes on the surface profile of it substrate. Glassy carbon has a density of 1.45 to 1.55 g/cc and a porosity less than 0.05%. It has a glass-like structure with random, long range order. Glassy carbon can be deposited on a surface in a thicker layer than can graphitc pyrolytic carbon and can have a smooth, glossy surface finish which is substantially smoother than the surface of the substrate on which it is deposited. Glassy carbon can also be intruded into a porous material to impregnate a surface depth region of that material with carbon. Both graphitic pyrolytic carbon and glassy carbon are herein considered to be pyrolytic carbons because they are generally made by a pyrolytic process. Both these forms of carbon are presently available in various forms from commercial suppliers.

The graphitic pyrolitic carbon of the lining 14 of the crucible 10 is a graphite coating formed by the decomposition of an organic vapor such as an alcohol or ether carried into a furnace chamber at 1600° C. to 2000° C. in an inert gas such as nitrogen or argon. The crucible is coated after having gone through the high temperature purification process.

Figure 2:
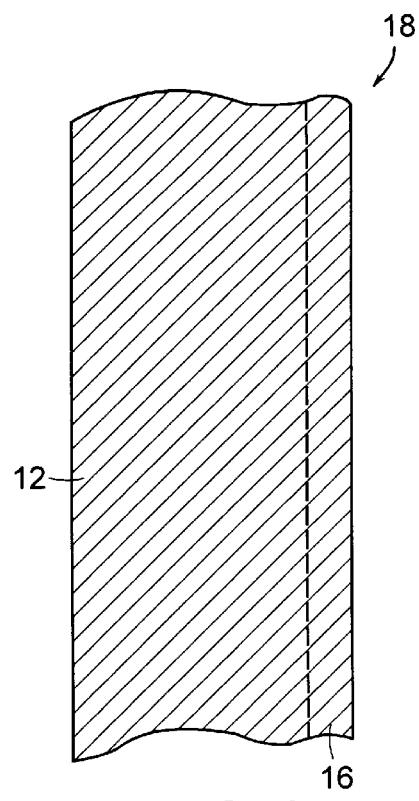
FIG. 2 is a schematic, cross-sectional view of a fragment of a crucible impregnated with glassy carbon in accordance with another embodiment of the novel invention.

Preferably the lining material is glassy carbon, either deposited on the surface as a coating, or, more preferably, as an impregnation of glassy carbon into the surface depth region 16 of the graphite as shown in FIG. 2 in the case of the crucible 18. The impregnation of the graphite seals the open porosity in the surface to less than 0.01% to prevent the leaking-through of any molten material. In so doing, it also makes the surface smoother.

Figure 3:
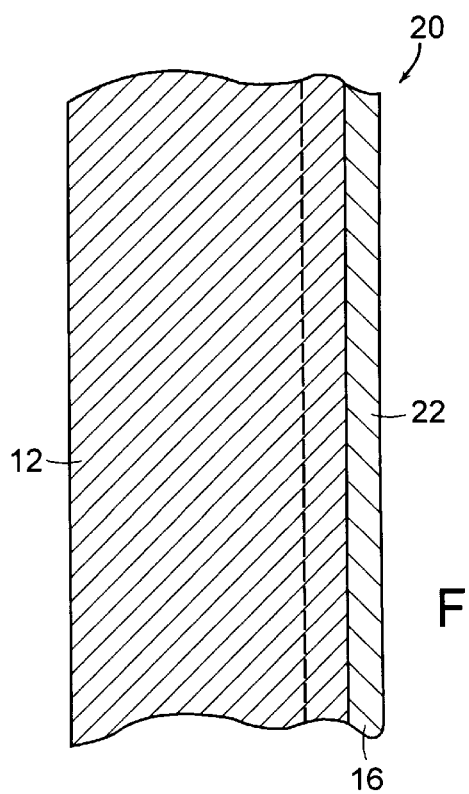
FIG. 3 is a schematic, cross-sectional view of a fragment of a crucible impregnated and coated with glassy carbon in accordance with another embodiment of the novel invention.

Even more preferably, the crucible is provided with impregnation and also with a coating of glassy carbon, as for the crucible 20 in FIG. 3. The crucible 20 is first impregnated with glassy carbon in the surface depth region 16 to a sufficient degree to fill in and seal any open surface porosity in the graphite surface. It is then coated with a layer 22 of glassy carbon thick enough to result in a glossy surface finish. The smooth, glossy surface finish reduces adhesion and also reduces the number of spurious nucleation sites, thereby improving the crystalline integrity of the resulting grown crystal.

EXAMPLE 1

A round graphite crucible without an inside lining and having an inside diameter if 7 inches and a wall 0.5 inches thick manufactured by MPG, Inc. of Cleveland, Ohio was loaded with 7.2 kg sodium iodide and 10 gram thallium iodide and placed into a growth furnace. Growth of crystal and an annealing cooling period were completed and the furnace opened. The crucible contained no crystal material. The molten material had leaked out of the crucible through the porous wall.

EXAMPLE 2

A crucible with an inside diameter of 3.5 inches and 12 inches tall having a wall thickness of one-eights inch and made entirely of graphite coated with graphitic pyrolytic carbon on the inside surface was loaded with 2.2 kilogram of sodium iodide and 4 gram of thallium iodide and placed in a furnace. The crystal growth process and annealing were completed as in Example 1, but including a 45 minute power interruption. The crucible did contain a crystal. The crystal suffered some cracking as a result of the power failure, but did not adhere to the crucible and appeared to be of otherwise good quality.

EXAMPLE 3

A crucible of type 9RL grade graphite manufactured by Airco Carbon and of the same dimensions as that of Example 1 was cleaned with a 44% hydrogen iodide solution and then rinsed with deionized water. It was then heated on a plate set to dry at 400–500 degrees C. for a full day. This grade of carbon had been known to be capable of retaining an alkali metal halide melt without leaking. The crucible was then loaded with 7.0 kilogram of pure sodium iodide and 15 grams of thallium iodide and placed in a furnace. Crystal growth and annealing proceeded as in Example 1. A crystal of good quality resulted. The crystal was easily removed from the crucible at room temperature with no reheating step was required. There was only slight adherence of the crystal to the wall of the crucible in two places. However, when a second crystal was grown in the crucible, the crystal adhered strongly to the crucible and could not be removed in its entirety without a remelting procedure. Therefore, such a crucible is not suitable for production.

EXAMPLE 4

A crucible identical to that of Example 3 was coated on the inside by chemical vapor deposition with a lining of silicon carbide about 0.003 inches thick. It was conditioned by baking at 800 degrees C. in a furnace under vacuum to remove any undesired gases and then loaded with 7 Kg (kilograms) of synthesized, pure sodium iodide and 14 grams thallium iodide. Crystal growth and annealing proceeded as in Example 1. The resulting crystal adhered tenaciously to the silicon carbide lining and could not be removed mechanically without damage.

EXAMPLE 5

The crucible of Example 3 was coated by chemical vapor deposition with an inner surface lining of pyrolytic graphite about 0.003 inches thick. It was loaded with 7 kilogram of synthesized, pure sodium iodide and 14 gram of thallium iodide. Crystal growth and annealing proceeded as in Example 1. However, annealing was speeded up somewhat. This was not thought to effect any adherence of the crystal to the wall, but posed the risk of some crystal fracturing. The resulting crystal was of excellent quality and exhibited no adherence whatever to the inside wall of the crucible. Nor did it have any thermal stress fractures.

EXAMPLE 6

A crucible such as that of Example 3, but of CG-27 grade graphite, was impregnated with glassy carbon to a depth of a few millimeters or more. Such impregnation with glassy carbon can presently be obtained through commercial coating service providers, for example such as EMC Industries, 8 Reading Road, Suite 110, Flemington, N.J., USA or Graphite Die Mold, Inc., 18 Air Line Park, Durham, Conn., USA,. The crucible was loaded with 7 kilograms of synthesized, pure sodium iodide and 14 grams of thallium iodide. Crystal growth and annealing proceeded as in Example 1. The resulting crystal was of excellent quality and exhibited no adherence whatever to the inside wall of the crucible, nor did it have any stress fractures. The advantage of using a crucible with glassy carbon impregnated into the surface is that the impregnation process seals all pores and forms a firm mechanical bond with the graphite. The obtained solid non-porous structure showed no tendency for the glassy carbon to disintegrate or separate from the graphite crucible body. The impregnation can be made as much as a centimeter in thickness, so that scratching of the surface has little effect on its integrity with regard to it resistance to wetting by the melt.

EXAMPLE 7

A graphite crucible of the type described in Example 1 above was impregnated with glassy carbon in a surface depth region as described in Example 6. It was then coated on the inside surface with a thin layer of glassy carbon, which provided a glossy finish to the inside surface. A sodium iodide crystal was grown in the crucible as described in Example 6. The crystal was easily freed from the crucible, had very little evidence of spurious nucleation along the outer perimeter surface, and was free of graphite dust contamination. The glassy coating maintained its integrity on the inside crucible surface. The glossy surface provided by the glassy carbon layer is thought to reduce the number of spurious nucleation sites to thereby reduce the tendency for additional crystals to grow and form grain boundaries in the boule.

EXAMPLE 8

A small crucible of the type described in Example 7 above was used to grow monocrystalline calcium fluoride ($CaF_2$). The crystal was readily removed from the crucible without breakage and was of excellent optical quality.

General Considerations

Graphitic pyrolytic carbon deposited by a vapor deposition process tends to be very thin. As a coating it takes on the surface profile of the underlying substrate. An attempt to make that coating thicker to hide some of the surface profile resulted in peeling of the coating after the first heating cycle of the crucible. The peeling was due to the lack of a strong mechanical bond and the mismatch of the thermal expansion between the crucible body and the coating. Additionally, since porous carbon cannot be machine-finished to a glossy finish, coating it with this graphitic type of pyrolytic carbon results in a dull finish which can lead to unwanted nucleation sites for the growing crystal. Glassy carbon impregnation and subsequent glassy carbon coating, both applied by a chemical deposition process, yield a mechanically strong, thermally compatible coating with a smooth, glossy surface which offers few nucleation sites. Glassy carbon impregnation into the porous graphite body offers the additional advantage of resisting mechanical damage to the integrity of the surface material.

While in the above examples the crystals which were grown were primarily sodium iodide, the crucibles in accordance with the present invention are suitable for growing other alkali halide crystals, such as calcium fluoride ($CaF_2$), and in general for growing crystals of or otherwise processing in a molten state any material which is suitable for such processing in a carbon vessel. Examples of other materials which are likely candidates for such processing are compounds of elements chosen from groups IIA and VIA of the Periodic Table of the Elements, such as cadmium zinc telluride (CdZnTe), and compounds of elements chosen from groups IIIA and VA of the Periodic Table of the Elements, such as gallium arsenide (GaAs), indium phosphide (InP), or gallium nitride (GaN).

While in the above examples, the impregnation and/or coating of the crucible is particularly advantageous if in/on the inside surface, such impregnation and/or coating can also be done over the entire surface of the crucible, both inside and outside. This can provide structural rigidity benefits to make the crucible more rugged. It can also improve the uniformity of heat transfer through the crucible wall thickness, which is desirable for the crystal growing process. Also, controlled impregnation of the surface depth region of the crucible surface can be used to affect the heat transfer through the wall thickness to favor uniform crystallization by countering other non-uniform thermal effects in the furnace in which the crucible is located. Finally, controlled impregnation of the crucible with additional carbon, particularly glassy carbon, can be used to adjust the electrical conductivity of the crucible material along the entire or along selected paths of the crucible surface depth region to permit the crucible itself to be used as a resistance heating element of the furnace.

We claim:

1. A method of growing monocrystalline material, comprising steps of:

placing a charge of crystal-forming raw material into a crucible made of porous carbon which has at least an interior surface treated with additional carbon to seal its open porosity and to provide a surface not wet by the raw material in its molten form, heating the crucible and charge to form a melt of the raw material in the crucible, controlling the temperature of the melt so that it crystallizes into a boule, cooling the crucible and its boule, and removing the boule from the crucible without remlting it where it contacts the crucible.

2. The method according to claim 1 wherein the additional carbon is a coating of graphitic pyrolytic carbon.

3. The method according to claim 1 wherein the additional carbon is a coating of glassy carbon.

4. The method according to claim 3 wherein at least the inside surface of the crucible is impregnated with glassy carbon to a depth sufficient to seal the open porosity in the surface.

5. The method according to claim 4 wherein the crucible is also coated at least on its impregnated inside surface with glassy carbon.

6. The method according to claim 5 wherein the the exposed surface of the glassy carbon coating is smoother than is the underlying impregnated graphite surface.

* * * * *